US012056367B2

(12) United States Patent
Na et al.

(10) Patent No.: US 12,056,367 B2
(45) Date of Patent: Aug. 6, 2024

(54) MEMORY SYSTEM AND OPERATING METHOD THEREOF FOR PERFORMING URGENT FINE PROGRAM OPERATION

(71) Applicant: SK hynix Inc., Icheon-si (KR)

(72) Inventors: Chung Un Na, Icheon-si (KR); Sang Sik Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 173 days.

(21) Appl. No.: 17/563,895

(22) Filed: Dec. 28, 2021

(65) Prior Publication Data

US 2023/0031193 A1 Feb. 2, 2023

(30) Foreign Application Priority Data

Aug. 2, 2021 (KR) .................. 10-2021-0101571

(51) Int. Cl.
*G06F 3/06* (2006.01)

(52) U.S. Cl.
CPC .......... *G06F 3/0619* (2013.01); *G06F 3/0658* (2013.01); *G06F 3/0679* (2013.01)

(58) Field of Classification Search
CPC ..... G06F 3/0619; G06F 3/0658; G06F 3/0679
See application file for complete search history.

(56) References Cited

U.S. PATENT DOCUMENTS

| 2012/0020160 A1* | 1/2012 | Nawata | G11C 11/5628 |
| | | | 365/185.11 |
| 2017/0271017 A1* | 9/2017 | Kanamori | G11C 16/3459 |
| 2019/0179567 A1* | 6/2019 | Kanno | G06F 3/0679 |
| 2019/0235787 A1* | 8/2019 | Kanno | G06F 3/0656 |
| 2019/0332327 A1* | 10/2019 | Ji | G06F 3/0659 |
| 2021/0223962 A1* | 7/2021 | Esaka | G06F 3/0679 |

FOREIGN PATENT DOCUMENTS

| KR | 20190125922 A | 11/2019 |
| KR | 20210001508 A | 1/2021 |

* cited by examiner

*Primary Examiner* — Eric T Loonan
(74) *Attorney, Agent, or Firm* — Perkins Coie LLP

(57) ABSTRACT

A memory system includes a nonvolatile memory device and a controller. The nonvolatile memory device includes a memory block including a plurality of memory cells, a first memory region of memory cells coupled to a first word line and a second memory region of memory cells coupled to a second word line. The controller performs a single level cell (SLC) program operation on the second memory region and perform a fine program operation on the first memory region after a completion of the SLC program operation on the second memory region.

14 Claims, 14 Drawing Sheets

MEMORY SYSTEM AND OPERATING METHOD THEREOF FOR PERFORMING URGENT FINE PROGRAM OPERATION

CROSS-REFERENCES TO RELATED APPLICATION

This patent document claims priority under 35 U.S.C. § 119(a) to Korean application number 10-2021-0101571, filed on Aug. 2, 2021, in the Korean Intellectual Property Office, which is incorporated herein by reference in its entirety as set forth in full.

TECHNICAL FIELD

Various embodiments are related to a memory system, and more particularly, to a memory system including a nonvolatile memory device.

BACKGROUND

A memory system may be configured to store data provided from a host device in response to a write request from the host device. Furthermore, the memory system may be configured to provide stored data to the host device in response to a read request from the host device. The host device is an electronic device capable of processing data and may include a computer, a digital camera, a mobile phone and so forth. The memory system to operate may be built in the host device or may be fabricated to be connected to and removed from the host device.

SUMMARY

In one aspect, a memory system is provided to include a nonvolatile memory device and a controller. The nonvolatile memory device may include a memory block including a plurality of memory cells, a first memory region of memory cells coupled to a first word line and a second memory region of memory cells coupled to a second word line. The controller may be configured to perform a single level cell (SLC) program operation on the second memory region and perform a fine program operation on the first memory region after a completion of the SLC program operation on the second memory region. In some implementations, the controller is configured to perform the SLC program operation in response to a determination that the fine program operation on the first memory region needs to be immediately performed without completing a foggy program operation on the second memory region.

In another aspect, a memory system is provided to include a nonvolatile memory device and a controller. The nonvolatile memory device may include a memory block including a first memory region of memory cells coupled to a first word line and a second memory region of memory cells coupled to a second word line. The controller may be configured to select a target data among data in the memory block on which a foggy program operation is completed but a fine program operation is not yet performed, and configured to perform a single level cell (SLC) program operation to store the target data into the second memory region.

In another aspect, an operating method of a memory system is provided. The operating method includes determining whether an urgent fine program operation is required on a first memory region that is coupled to a first word line and within a memory block of the memory system, the urgent fine program operation corresponding to a fine program operation required to be immediately performed without completing a foggy program operation on a second memory region that is coupled to a second word line and within the memory block; selecting, among data stored in a memory, target data to be stored in the second memory region; performing an urgent single level cell (SLC) program operation to store the target data into the second memory region; and performing the urgent fine program operation on the first memory region after the performing of the urgent SLC program operation on the second memory region.

DETAILED DESCRIPTION

Exemplary embodiments of the disclosed technology will be described below in more detail with reference to the accompanying drawings. The present disclosure may, however, be embodied in different forms and should not be construed as limited to the embodiments set forth herein.

The drawings are not necessarily to scale and, in some instances, proportions may have been exaggerated in order to clearly illustrate features of the embodiments.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, exemplary embodiments of the disclosed technology will be described below with reference to the accompanying drawings.

According to an embodiment, provided may be a memory system capable of improving memory space availability while securing data reliability, and an operating method of the memory system.

Figure 1:
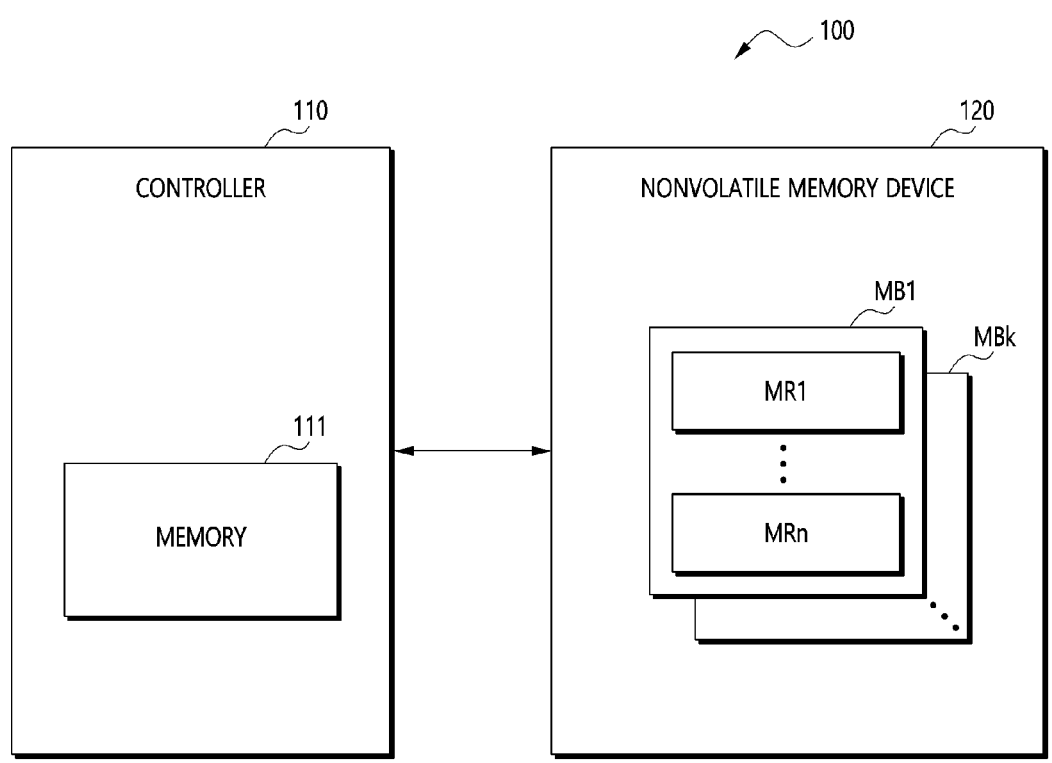
FIG. 1 is a block diagram illustrating a memory system according to an embodiment of the disclosed technology.

FIG. 1 is a block diagram illustrating a memory system 100 according to an embodiment.

The memory system 100 may be configured to store therein data provided from an external host device in response to a write request from the host device. The memory system 100 may be configured to provide stored data to the host device in response to a read request from the host device.

The memory system 100 may be configured as a personal computer memory card international association (PCMCIA) card, a compact flash (CF) card, a smart media card, a memory stick, various multimedia cards (e.g., MMC, eMMC, RS-MMC, and MMC-micro), secure digital (SD) cards (e.g., SD, Mini-SD and Micro-SD), a universal flash storage (UFS) or a solid state drive (SSD).

The memory system 100 may include a controller 110 and a nonvolatile memory device 120.

The controller 110 may control an overall operation of the memory system 100. The controller 110 may control the nonvolatile memory device 120 in order to perform a foreground operation in response to an instruction from a host device. The foreground operation may include operations of writing data into the nonvolatile memory device 120 and reading data from the nonvolatile memory device 120 in response to instructions from the host device, that is, a write request and a read request.

Furthermore, the controller 110 may control the nonvolatile memory device 120 in order to perform an internally required background operation independently of the host device. The background operation may include at least one of a wear-leveling operation, a garbage collection operation, an erase operation, a read reclaim operation and a refresh operation for the nonvolatile memory device 120. Like the foreground operation, the background operation may include operations of writing data into the nonvolatile memory device 120 and reading data from the nonvolatile memory device 120.

The controller 110 may include a memory 111. The memory 111 may operate as an operational memory, a buffer memory or a cache memory. As an operational memory, the memory 111 may store therein various program data and a software program that is driven by the controller 110. As a buffer memory, the memory 111 may buffer data that is transferred between an external device and the nonvolatile memory device 120. As a cache memory, the memory 111 may temporarily store therein cache data. The memory 111 may include a volatile memory device. The volatile memory device may include a Dynamic Random Access Memory (DRAM), a Static Random Access Memory (SRAM) and so forth.

The controller 110 may store data into a memory region within the nonvolatile memory device 120 according to a foggy-fine program scheme. According to the foggy-fine program scheme, to write the bits in a memory cell, the data needs to be first written by a foggy program operation and then a fine program operation is performed after the foggy program operation. The foggy-fine program scheme will be described in detail with reference to FIG. 3.

When an urgent fine program operation is required for a particular memory region of a particular memory block of the nonvolatile memory device 120, the particular memory region coupled to a particular word line (e.g., a first word line), the controller 110 may perform an urgent single level cell (SLC) program operation on a selected memory region and may perform the urgent fine program operation on the particular memory region after completion of the urgent SLC program operation on the selected memory region. The urgent fine program operation and the urgent single level cell (SLC) program operation will be explained in detail with reference to FIG. 5. The selected memory region may be coupled to a second word line that is subsequent to the first word line and may be a memory region adjacent to the particular memory region on which the urgent fine program operation is to be performed. The selected memory region may correspond to a memory region that needs to be programmed prior to a particular memory region on which the urgent fine program operation is to be performed, according to a predetermined program sequence.

The controller 110 may select target data among data on which a foggy program operation is completed but a fine program operation is not yet performed in the particular memory block and may store the target data into the selected memory region through the urgent SLC program operation. In an embodiment, the target data may include data on which the foggy program operation is completed most recently, among data on which the foggy program operation is completed but the fine program operation is not yet performed in the particular memory block.

The controller 110 may keep, in the memory 111, the data on which the foggy program operation is completed but the fine program operation is not yet performed in the particular memory block, until the fine program operation is completed on the data. Therefore, the controller 110 may select the target data from the data kept in the memory 111 and may provide the target data to the nonvolatile memory device 120.

A memory region storing the target data may be referred to as a target memory region. Thus, the target memory region may be a memory region on which the foggy program operation is completed but the fine program operation is not yet performed, and may store the target data through the foggy program operation. In an embodiment, the controller 110 may skip the fine program operation on the target memory region when all the data stored in the target memory region are selected as the target data for one or more urgent SLC program operations and the urgent SLC program operations are completed. When determining to skip the fine program operation on the target memory region, the controller 110 may update, as invalid data, all the data stored in the target memory region and may update, as valid data, the target data stored in one or more selected memory regions through the one or more urgent SLC program operations.

Under the control of the controller 110, the nonvolatile memory device 120 may store therein data provided from the controller 110 and may read stored data to provide the controller 110 with the read data. The nonvolatile memory device 120 may include a plurality of memory blocks MB1 to MBk. The nonvolatile memory device 120 may perform an erase operation in units of memory blocks. That is, all data stored in a single memory block may be erased at the same time. Each of the memory blocks MB1 to MBk may include a plurality of memory regions MR1 to MRn. The nonvolatile memory device 120 may perform a program or read operation in units of memory regions.

The nonvolatile memory device 120 may include a flash memory device (e.g., the NAND Flash or the NOR Flash), the Ferroelectrics Random Access Memory (FeRAM), the Phase-Change Random Access Memory (PCRAM), the Magnetic Random Access Memory (MRAM), the Resistive Random Access Memory (ReRAM) and so forth.

The nonvolatile memory device 120 may include one or more planes, one or more memory chips, one or more memory dies or one or more memory packages.

Although FIG. 1 illustrates the memory system 100 including a single nonvolatile memory device 120, a number of nonvolatile memory devices included in the memory system 100 will not be limited thereto.

Figure 2A:
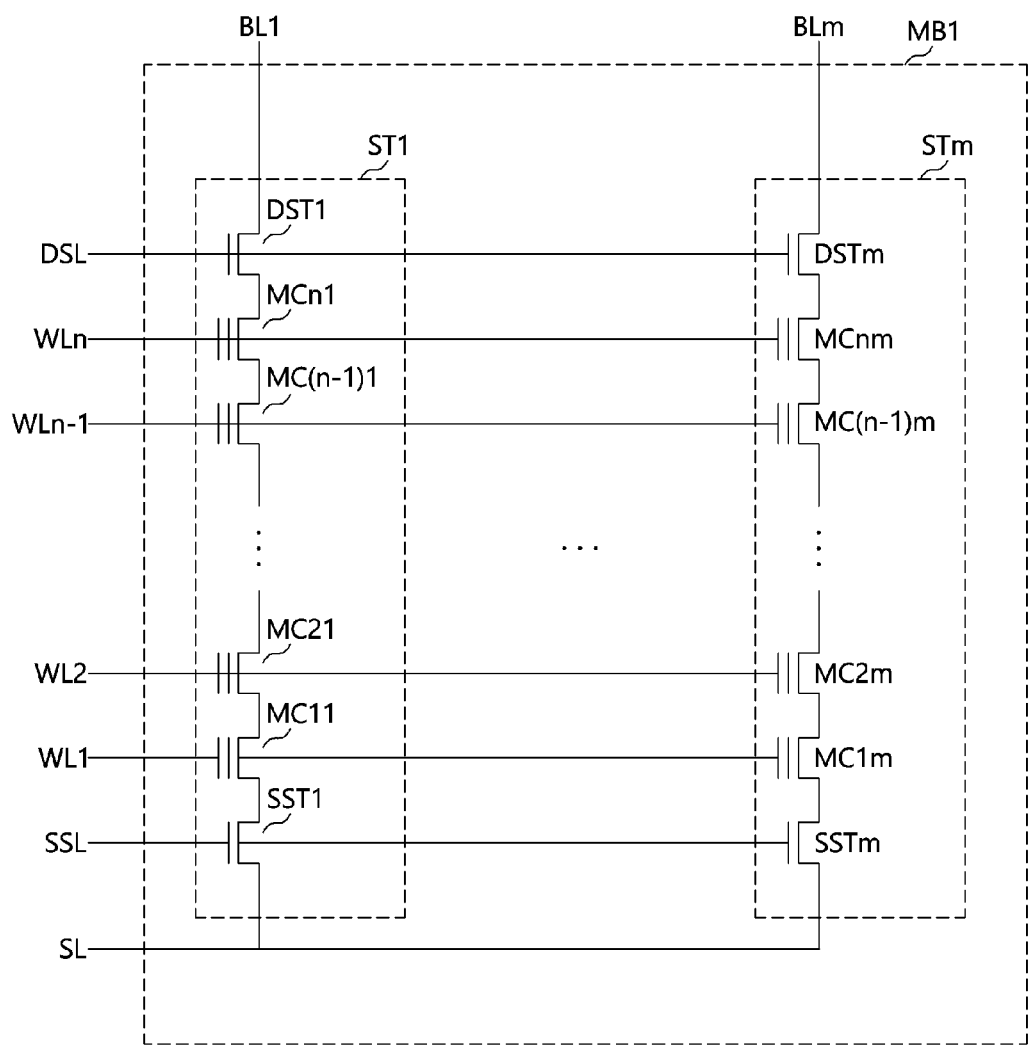
FIGS. 2A and 2B are detailed diagrams illustrating a memory block of FIG. 1.
Figure 2B:
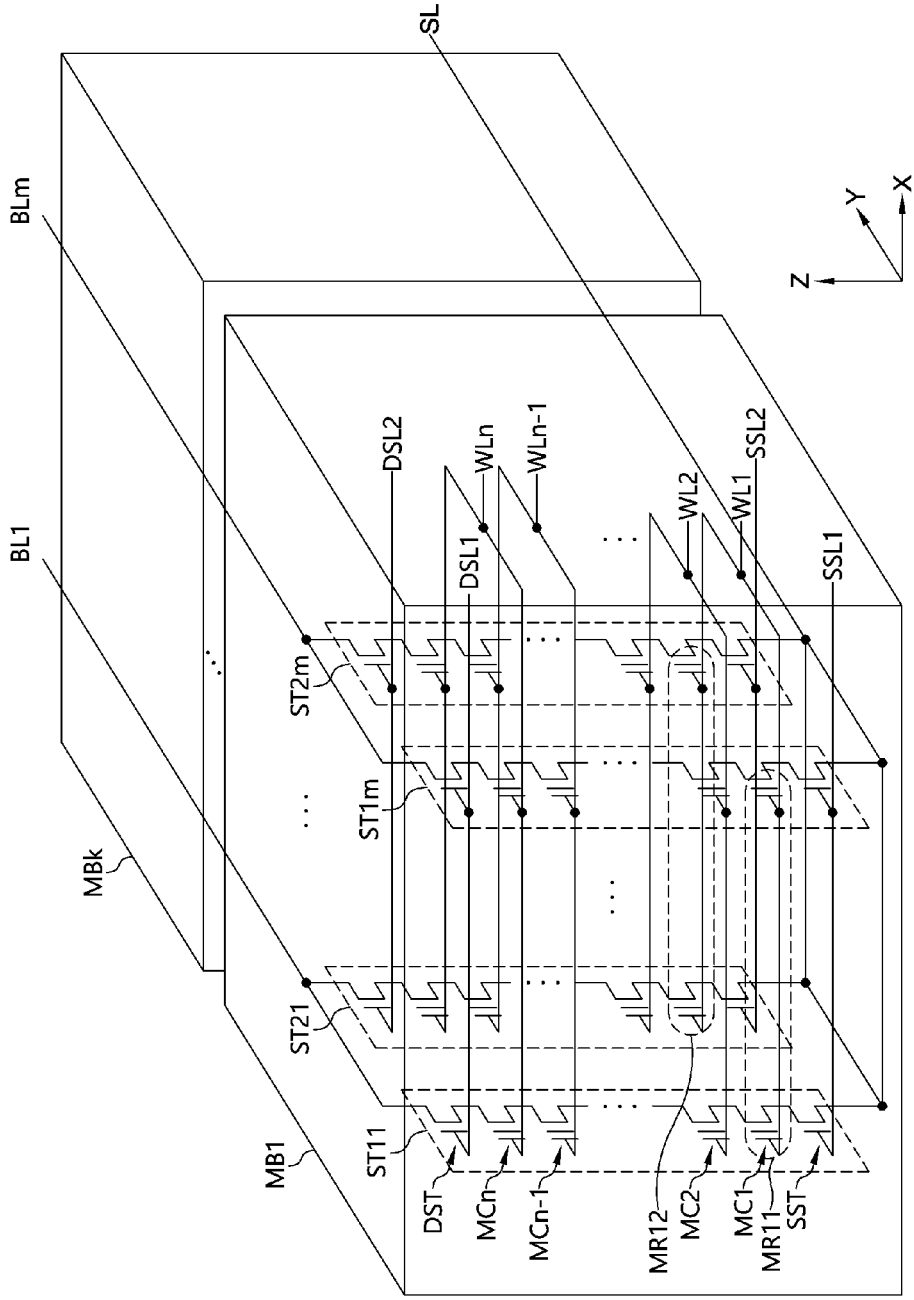

FIGS. 2A and 2B are detailed diagrams illustrating the memory block MB1 of FIG. 1. Each of the memory blocks MB1 to MBk illustrated in FIG. 1 may be configured in substantially the same way as the configuration illustrated in FIG. 2A or 2B.

Referring to FIG. 2A, the memory block MB1 may be coupled to a plurality of word lines WL1 to WLn arranged in parallel between a source select line SSL and a drain select line DSL. The memory block MB1 may include a plurality of strings ST1 to STm. Bit lines BL1 to BLm may be coupled respectively to the strings ST1 to STm. A source line SL may be coupled commonly to the strings ST1 to STm. The strings ST1 to STm may be configured in substantially the same way as each other and thus the string ST1 coupled to the bit line BL1 will be described as an example.

The string ST1 may include a source select transistor SST1, a plurality of memory cells MC11 to MCn1 and a drain select transistor DST1, which are serially coupled to each other between the source line SL and the bit line BL1. Each memory cell is structured to store data. As explained below, a memory region may include different memory cells that are connected to the same word line.

The source select transistor SST1 may be coupled to the source line SL at its source. The drain select transistor DST1 may be coupled to the bit line BL1 at its drain. The memory cells MC11 to MCn1 may be serially coupled to each other between the source select transistor SST1 and the drain select transistor DST1. Source select transistors SST1 to SSTm included respectively in the strings ST1 to STm may be coupled to the source select line SSL at their gates. Drain select transistors DST1 to DSTm may be coupled to the drain select line DSL at their gates. Memory cells MC11 to MC1m and MCn1 to MCnm may be coupled respectively to the word lines WL1 to WLn at their gates. Memory cells coupled to the same word line among the memory cells MC11 to MC1m and MCn1 to MCnm may be simultaneously programmed during a program operation. Memory cells coupled to the same word line among the memory cells MC11 to MC1m and MCn1 to MCnm may configure or form one memory region.

One or more bits may be stored in each of the memory cells MC11 to MC1m and MCn1 to MCnm. When storing a single bit, two bits, three bits and four bits, a memory cell may be referred to as a single level cell (SLC), a multi-level cell (MLC), a triple-level cell (TLC) and a quadruple-level cell (QLC), respectively.

Referring to FIG. 2B, the memory block MB1 may include strings ST11 to ST1nn and ST21 to ST2m. Each of the strings ST11 to ST1nn and ST21 to ST2m may extend in a vertical direction (i.e., in a Z direction). In the memory block MB1, 'm' number of strings may be arranged in a row direction (i.e., in an X direction). Although FIG. 2B illustrates two strings arranged in a column direction (i.e., in a Y direction), three or more strings may be arranged in the column direction (the Y direction).

The strings ST11 to ST1nn and ST21 to ST2m may be configured in the same way as each other. For example, the string ST11 may include a source select transistor SST, memory cells MC1 to MCn, and a drain select transistor DST, which are serially coupled to each other between the source line SL and the bit line BL1. The source select transistor SST may be coupled to the source line SL at its source. The drain select transistor DST may be coupled to the bit line BL1 at its drain. The memory cells MC11 to MCn1 may be serially coupled to each other between the source select transistor SST and the drain select transistor DST.

Source select transistors included respectively in the strings arranged in the same row may be coupled to the same source select line at their gates. For example, the source select transistors of the strings ST11 to ST1nn arranged in a first row may be coupled to a source select line SSL1 at their gates. The source select transistors of the strings ST21 to ST2m arranged in a second row may be coupled to a source select line SSL2 at their gates. In an embodiment, the source select transistors of the strings ST11 to ST1nn and ST21 to ST2m may be coupled in common to a single source select line.

Drain select transistors included respectively in the strings arranged in the same row may be coupled to the same drain select line at their gates. For example, the drain select transistors of the strings ST11 to ST1nn arranged in a first row may be coupled to a drain select line DSL1 at their gates. The drain select transistors of the strings ST21 to ST2m arranged in a second row may be coupled to a drain select line DSL2 at their gates.

Strings arranged in the same column may be coupled to the same bit line. For example, strings ST11 and ST21 arranged in a first column may be coupled to a bit line BL1. Strings ST1nn and ST2m arranged in a m-th column may be coupled to a bit line BLm.

Memory cell arranged at the same location in the vertical direction may be coupled to the same word line at their gates. For example, memory cells arranged at the same location as the memory cell MC1 in the vertical direction within the strings ST11 to ST1nn and ST21 to ST2m may be coupled to the word line WL1.

Within the memory block MB1, memory cells arranged in the same row and coupled to the same word line may configure or form one memory region. For example, memory cells arranged in a first row and coupled to the word line WL1 may configure a memory region MR11. Memory cells arranged in a second row and coupled to the word line WL1 may configure or form a memory region MR12. Across a number of rows, each word line may be coupled to a plurality of memory regions. In operation, memory cells within a single memory region may be simultaneously programmed.

Figure 3:
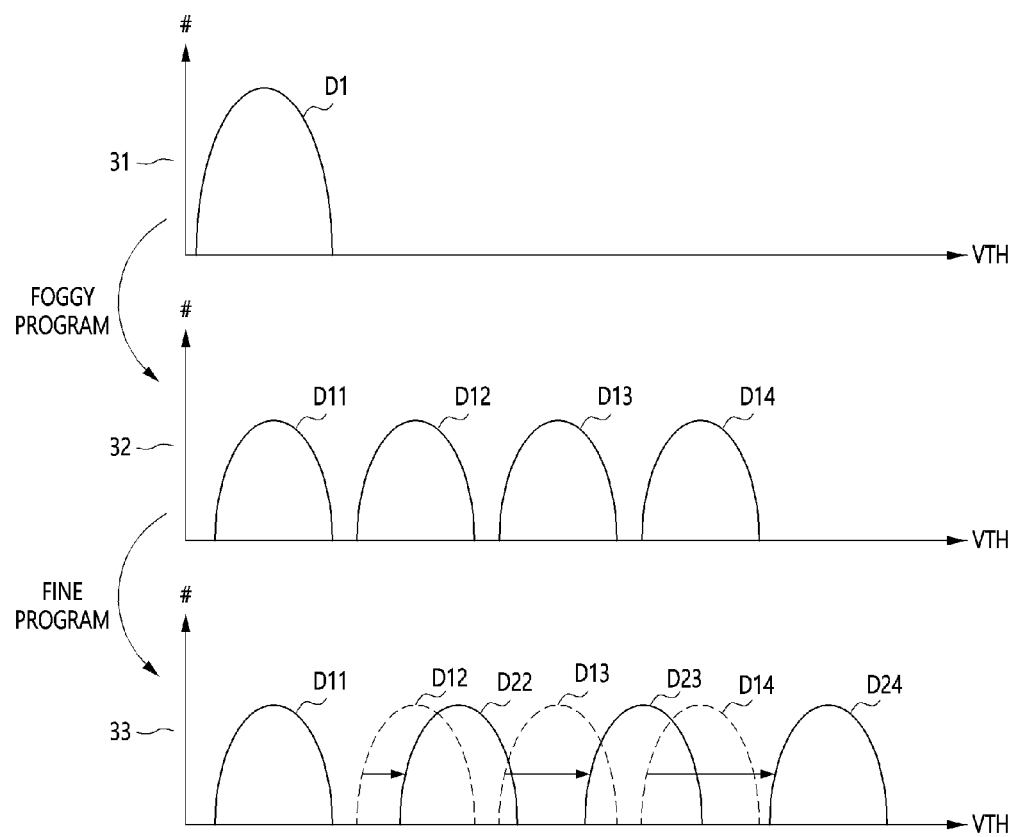
FIG. 3 is a diagram illustrating an operation that a controller of FIG. 1 stores data in a memory region according to an embodiment of the disclosed technology.

FIG. 3 is a diagram illustrating an operation that the controller 110 of FIG. 1 stores data in a memory region according to an embodiment. Referring to statuses 31 to 33 of FIG. 3, the horizontal axis VTH represents threshold voltages of memory cells and the vertical axis #represents a number of memory cells having the threshold voltages represented by the horizontal axis. It is assumed that the memory cells operate as MLCs.

Status 31 corresponds to the erased state of the memory cell configuring a single memory region. Referring to the status 31 of FIG. 3, memory cells configuring a single memory region and in an erased state may form a threshold voltage distribution D1.

Status 32 corresponds to the status of the memory cell after the foggy program operation has been performed on the memory region. Referring to the status 32 of FIG. 3, the memory cells may form threshold voltage distributions D11 to D14 after completion of a foggy program operation on the memory region. Since two bits are stored in each memory cell, the memory cells may form four number of threshold voltage distributions D11 to D14. Each memory cell may store two bits of a value corresponding to a threshold voltage distribution, to which the memory cell belongs. Margins between the threshold voltage distributions D11 to D14 are relatively narrow and thus data stored in each memory cell may be in an unstable state.

Status 33 corresponds to the status of the memory cell after the fine program operation has been performed on the memory region. Referring to the status 33 of FIG. 3, the memory cells may form threshold voltage distributions D11 and D22 to D24 after completion of a fine program operation on the memory region. Through the fine program operation, the threshold voltage distribution D12 may change to the threshold voltage distribution D22, the threshold voltage distribution D13 may change to the threshold voltage distribution D23 and the threshold voltage distribution D14 may change to the threshold voltage distribution D24. Therefore, margins between the threshold voltage distributions D11 and D22 to D24 becomes greater than the margins between the threshold voltage distributions D11 to D14 and thus data reliability may become improved. Thus, data stored through the foggy program operation may become stable when the fine program operation is completed on the data.

In an embodiment, the memory cells may form $2^k$ number of threshold voltage distributions when each memory cell stores k number of bits. In this case, the foggy program operation and the fine program operation may be performed on the memory cells in substantially the same way as illustrated in FIG. 3. The $2^k$ number of threshold voltage distributions may have relatively narrow margins when the foggy program operation is completed on the memory cells and may have greater and stable margins when the fine program operation is completed on the memory cells.

Figure 4:
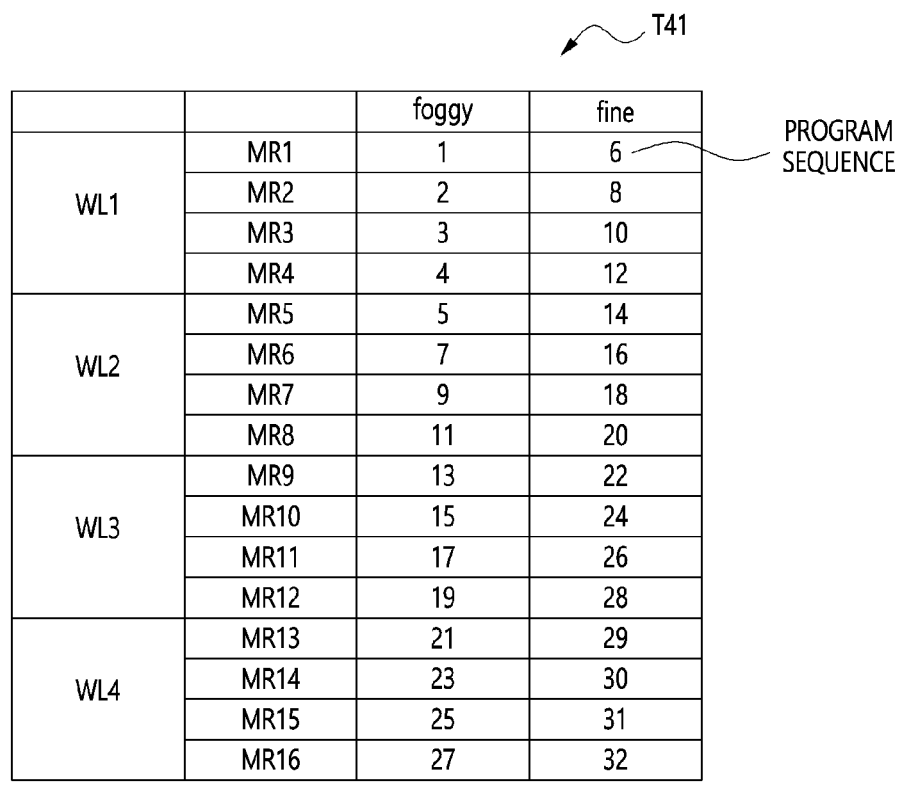
FIG. 4 is a table illustrating a program sequence on memory regions included in each memory block according to an embodiment of the disclosed technology.

FIG. 4 is a table T41 illustrating a program sequence on memory regions included in each memory block according to an embodiment. In the following description, it is assumed that a single memory block is coupled to four word lines, each of which is coupled to four memory regions. In the following description, a memory block is assumed to have a 3D structure as illustrated in FIG. 2B. The following description will be applied to a memory block having a 2D structure as illustrated in FIG. 2A.

Referring to FIG. 4, a first column of the table T41 may represent four word lines WL1 to WL4 coupled to a memory block. For example, the first to fourth word lines WL1 to WL4 may be sequentially arranged in the Z direction illustrated in FIG. 2B.

A second column of the table T41 may represent sixteen memory regions MR1 to MR16. Four memory regions are coupled to a corresponding word line such that memory regions MR1 to MR4 are coupled to a first word line WL1, memory regions MR5 to MR8 are coupled to a second word line WL2, memory regions MR9 to MR12 are coupled to a third word line WL3, and memory regions MR13 to MR16 are coupled to a fourth word line WL4. Four number of memory regions coupled to each of the first to fourth word lines WL1 to WL4 may be sequentially arranged in the Y direction illustrated in FIG. 2B.

Third and fourth columns of the table T41 may indicate program sequences, i.e., a sequence that foggy program operations are performed and a sequence that the fine program operations are performed. According to the program sequence, program operations may be performed sequentially from a first program operation, which is a foggy program operation on the first memory region MR1, to a thirty second program operation, which is a fine program operation on the sixteenth memory region MR16.

Hereinafter, the program sequence will be described. As the first to fourth program operations, the foggy program operations may be consecutively and sequentially performed on the first to fourth memory regions MR1 to MR4 coupled to the first word line WL1 arranged first and coupled to the memory block.

The foggy program operations may be sequentially performed on the fifth to sixteenth memory regions MR5 to MR16 according to the arranged sequence of the fifth to sixteenth memory regions MR5 to MR16. The fine program operations may be performed on the first to twelfth memory regions MR1 to MR12 according to a predetermined rule. In some implementations, a fine program operation may be performed on a particular memory region coupled to a particular word line after a foggy program operation is completed on a memory region that is adjacent to the particular memory region and coupled to a subsequent word line to the particular word line. The memory region adjacent to the particular memory region and coupled to the subsequent word line may be a memory region adjacent to the particular memory region in the Z direction illustrated in FIG. 2B. For example, the fine program operation (i.e., the sixth program operation) may be performed on the first memory region MR1 coupled to the first word line WL1 after the foggy program operation (i.e., the fifth program operation) is completed on the fifth memory region MR5 adjacent to the first memory region MR1 and coupled to the subsequent word line (i.e., the second word line WL2). After the completion of the fifth program operation, the sixth program operation may be performed prior to any other program operation.

As the twenty ninth to thirty second program operations, fine program operations may be consecutively and sequentially performed on the thirteenth to sixteenth memory regions MR13 to MR16 coupled to the fourth word line WL4 arranged last and coupled to the memory block.

In some implementations, the foggy program operations may be sequentially performed on the first to sixteenth memory regions MR1 to MR16 according to the arranged sequence of the first to sixteenth memory regions MR1 to MR16. A fine program operation may be performed on a particular memory region prior to any other program operation after a foggy program operation is completed on a memory region adjacent to the particular memory region and coupled to a subsequent word line. After completion of all the foggy program operations, remaining fine program operations may be consecutively and sequentially performed.

The above-described program sequence may be to minimize the interference effect that may be caused due to the program operation. If the fifth program operation is performed after the sixth program operation is completed, which is different from the program sequence of the table T41, the fifth program operation may cause the interference effect on the first memory region MR1 on which the fine program operation is already completed, and thus may damage data stored in the first memory region MR1. However, if the sixth program operation is performed after the fifth program operation is completed according to the program sequence of the table T41, the sixth program operation may remove the interference effect, which is on the first memory region MR1 due to the fifth program operation. Therefore, the program sequence of the table T41 may minimize the interference effect due to a program operation and thus may improve data reliability.

Figure 5:
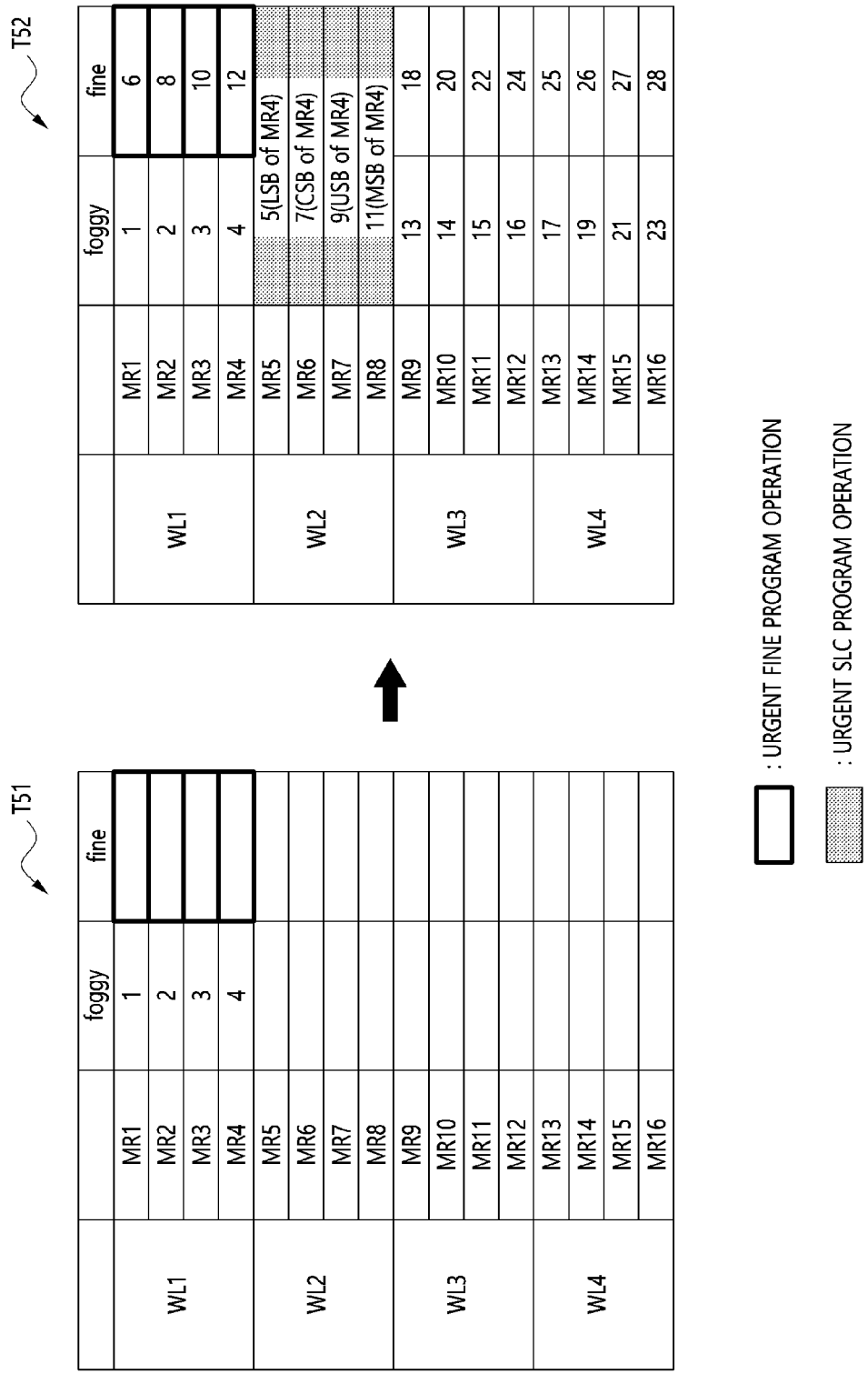
FIG. 5 is a diagram illustrating an operation of a controller of FIG. 1 according to an embodiment of the disclosed technology.

FIG. 5 is a diagram illustrating an operation of the controller 110 of FIG. 1 according to an embodiment of the disclosed technology.

Referring to FIG. 5, a table T51 shows a situation that the first to fourth program operations (i.e., the foggy program operations on the first to fourth memory regions MR1 to MR4) are completed. Unstable data stored in the first to fourth memory regions MR1 to MR4 may become stable when the fine program operations are completed on the first to fourth memory regions MR1 to MR4. According to the program sequence of the table T41, the fine program operations may be performed on the first to fourth memory regions MR1 to MR4 once the foggy program operations are completed on the fifth to eighth memory regions MR5 to MR8, respectively.

There are some circumstances, however, that the fine program operations are required to be immediately completed on the first to fourth memory regions MR1 to MR4 even when the foggy program operations are not completed on the fifth to eight memory regions, MR5 to MR8. For example, the foggy program operations cannot be performed on the fifth to eighth memory regions MR5 to MR8 when data to be stored in the fifth to eighth memory regions MR5 to MR8 are not yet provided from a host device.

For example, the case that the fine program operations are required to be immediately completed on the first to fourth memory regions MR1 to MR4 may include when a threshold amount of time elapses from the completion of the first to fourth program operations. For example, the case that the fine program operations are required to be immediately completed on the first to fourth memory regions MR1 to MR4 may include when normal or abnormal power-off occurs at the completion of the first to fourth program operations. Those fine program operations which are required to be immediately completed on the first to fourth memory regions MR1 to MR4 may be referred to as urgent fine program operations. Thus, an urgent fine program operation may be a fine program operation required to be immediately completed on a particular memory region coupled to a particular word line although a foggy program operation on another memory region adjacent to the particular memory region and coupled to a subsequent word line to the particular word line is not completed. In the example, when data to be stored in another memory region adjacent to the particular memory region and coupled to the subsequent word line is not yet provided from a host device, the foggy program operation on another memory region cannot be completed.

Referring to FIG. 5, a table T52 shows a result of the program operations performed according to an embodiment of the disclosed technology. Through the urgent SLC program operations, the controller 110 may store target data, which is selected according to a predetermined condition, into the fifth to eighth memory regions MR5 to MR8. The urgent SLC program operation may be a SLC program operation, which is to be performed on a memory region adjacent to a particular memory region and coupled to a subsequent word line, when the urgent fine program operation is required to be performed on the particular memory region. The urgent SLC program operations may be performed on the fifth to eighth memory regions MR5 to MR8 instead of the foggy program operations on the fifth to eighth memory regions MR5 to MR8. Thus, the urgent SLC program operations may be sequentially performed on the fifth to eighth memory regions MR5 to MR8 according to the program sequence of the foggy program operations on the fifth to eighth memory regions MR5 to MR8. After an urgent SLC program operation is completed on a memory region adjacent to the particular memory region and coupled to a subsequent word line, an urgent fine program operation can be performed on a particular memory region prior to any other program operation. After completion of all the urgent fine program operations on the first to fourth memory regions MR1 to MR4, remaining program operations may be performed on the ninth to sixteenth memory regions MR9 to MR16 according to the program sequence described with reference to the table T41 of FIG. 4.

The target data to be stored into the fifth to eighth memory regions MR5 to MR8 through the urgent SLC program operations may be selected from data for which a foggy program operation is completed but a fine program operation is not yet performed in the particular memory block. The data for which a foggy program operation is completed but a fine program operation is not yet performed in the particular memory block can be kept in the memory 111 until the fine program operation is completed for the data. Thus, the target data can be selected from such data for which a foggy program operation is completed but a fine program operation is not yet performed in the particular memory block. In order to perform the urgent SLC program operation, the controller 110 may select the target data from data kept in the memory 111 and may provide the target data from the memory 111 to the nonvolatile memory device 120. For example, the target data may be data (i.e., data stored in the fourth memory region MR4) for which the foggy program operation is completed most recently but the fine program operation is not yet performed, as illustrated in FIG. 5. In other embodiments, the target data may be data stored in one of the first to third memory regions MR1 to MR3.

In some implementations, the target data may be selected according to a number of memory regions (e.g., four number in the case of FIG. 5) on which the urgent SLC program operations are to be performed. For example, when memory cells within the fourth memory region MR4 operate as QLCs, the target data to be stored in the respective fifth to eighth memory regions MR5 to MR8 may be Least Significant Bit (LSB) data, Central Significant Bit (CSB) data, Upper Significant Bit (USB) data and Most Significant Bit (MSB) data, respectively, which are stored in the fourth memory region MR4.

The fourth memory region MR4 may be the target memory region. Thus, the target memory region may be a memory region storing therein the target data through the foggy program operation. In an embodiment, the urgent fine program operation may be skipped or omitted on the target memory region (e.g., the fourth memory region MR4) after the completion of the urgent SLC program operations on the fifth to eighth memory regions MR5 to MR8. It is because all data stored in the target memory region (i.e., the fourth memory region MR4) become stored in SLCs of the fifth to eighth memory regions MR5 to MR8 through the urgent SLC program operations and thus the data can be read from the fifth to eighth memory regions MR5 to MR8 with a higher speed and higher reliability. Accordingly, the urgent fine program operation may be skipped or omitted on the target memory region (i.e., the fourth memory region MR4) because it is not required to use the target data unstably stored in the target memory region (i.e., the fourth memory region MR4) and therefore the urgent fine program operation may not be required on the fourth memory region MR4. In this case, the controller 110 may update, as invalid data, the target data stored in the target memory region (i.e., the fourth memory region MR4) and may update, as valid data, the target data stored in the selected memory regions (i.e., the fifth to eighth memory regions MR5 to MR8). The controller 110 may perform the update to the invalid data and the valid data through a mapping table including mapping information between logical addresses and physical addresses.

In an embodiment, the controller 110 may perform the urgent fine program operation (i.e., the twelfth program operation) on the target memory region (i.e., the fourth memory region MR4) instead of the skip or the omission of the urgent fine program operation. In this case, the target data stored in the fourth memory region MR4 may become more stable. The target data stored in the fifth to eighth memory regions MR5 to MR8 may be utilized as backup data for the target data stored in the fourth memory region MR4.

In some implementations, the urgent SLC program operation may be performed on a memory region adjacent to a particular memory region and coupled to a subsequent word line prior to the urgent fine program operation on the particular memory region, which can minimize the interference effect. According to the embodiment, the target data for the urgent SLC program operation may be selected from more meaningful data. Accordingly, the memory region adjacent to the particular memory region and coupled to the subsequent word line is not be wasted. Further, the target data can be stored more stably into the memory region adjacent to the particular memory region and coupled to the subsequent word line and thus the target data may be read with a higher speed.

Figure 6:
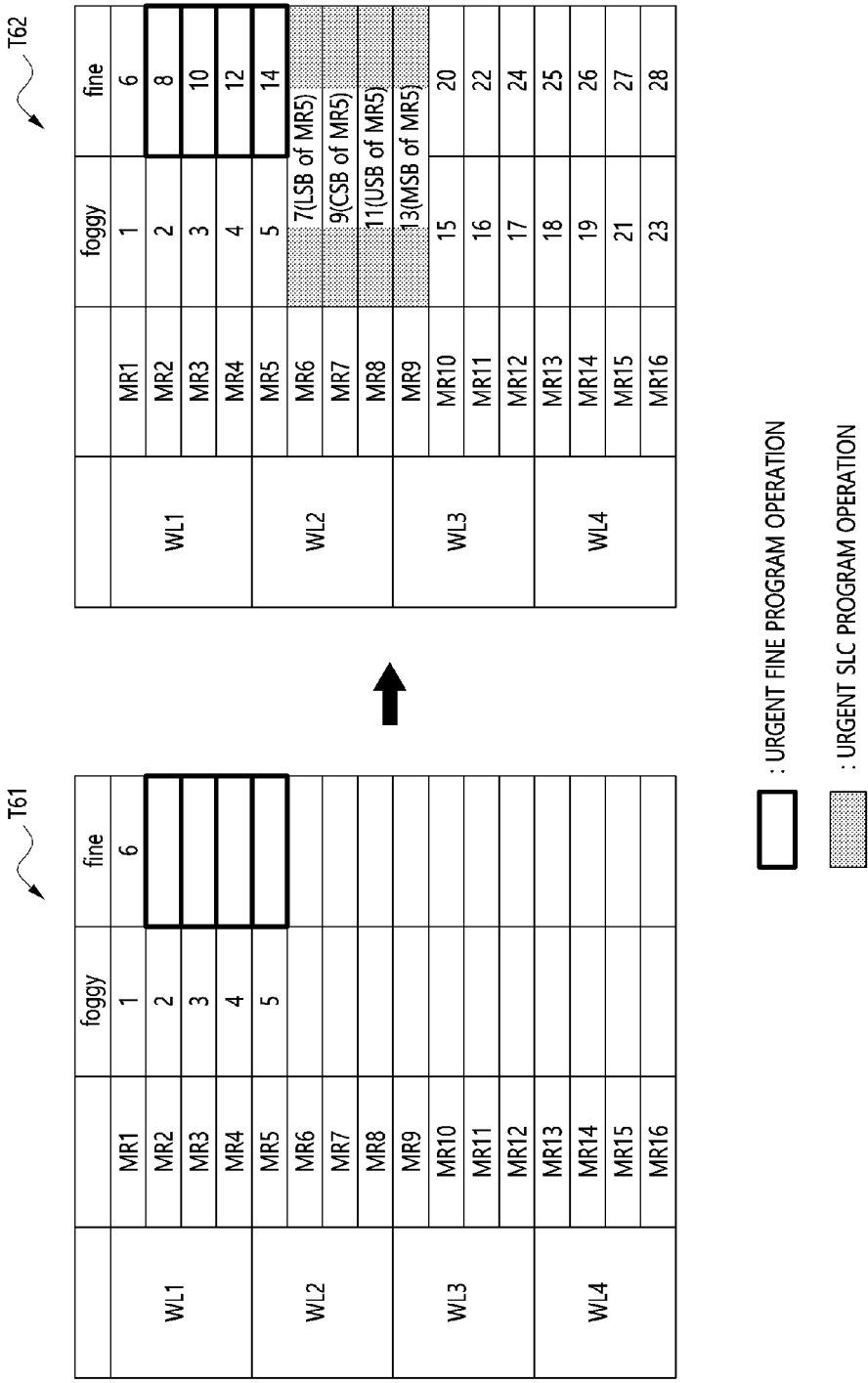
FIG. 6 is a diagram illustrating an operation of a controller of FIG. 1 according to an embodiment of the disclosed technology.

FIG. 6 is a diagram illustrating an operation of the controller 110 of FIG. 1 according to an embodiment of the disclosed technology.

Referring to FIG. 6, a table T61 shows a situation that the first to sixth program operations, which include the foggy program operations on the first to fifth memory regions MR1 to MR5 and the fine program operation on the first memory region MR1, are completed. In this situation, assume that the urgent fine program operations are required to be performed on the second to fifth memory regions MR2 to MR5.

Referring to FIG. 6, a table T62 shows a result of the program operations performed according to an embodiment. The result illustrated by the table T62 may be similar to the result illustrated by the table T52 of FIG. 5. However, the urgent SLC program operations may be performed on the sixth to ninth memory regions MR6 to MR9. The target data may be data (i.e., data stored in the fifth memory region MR5) for which a foggy program operation is completed most recently but a fine program operation is not yet performed, as illustrated in FIG. 6. When memory cells within the target memory region (i.e., the fifth memory region MR5) operate as QLCs, the target data to be stored in the respective sixth to ninth memory regions MR6 to MR9 may be respectively LSB data, CSB data, USB data and MSB data stored in the target memory region (i.e., the fifth memory region MR5). In an embodiment, the urgent fine program operation on the target memory region (e.g., the fifth memory region MR5), i.e., the fourteenth program operation, may be skipped or omitted after the completion of the urgent SLC program operations on the sixth to ninth memory regions MR6 to MR9.

Figure 7:
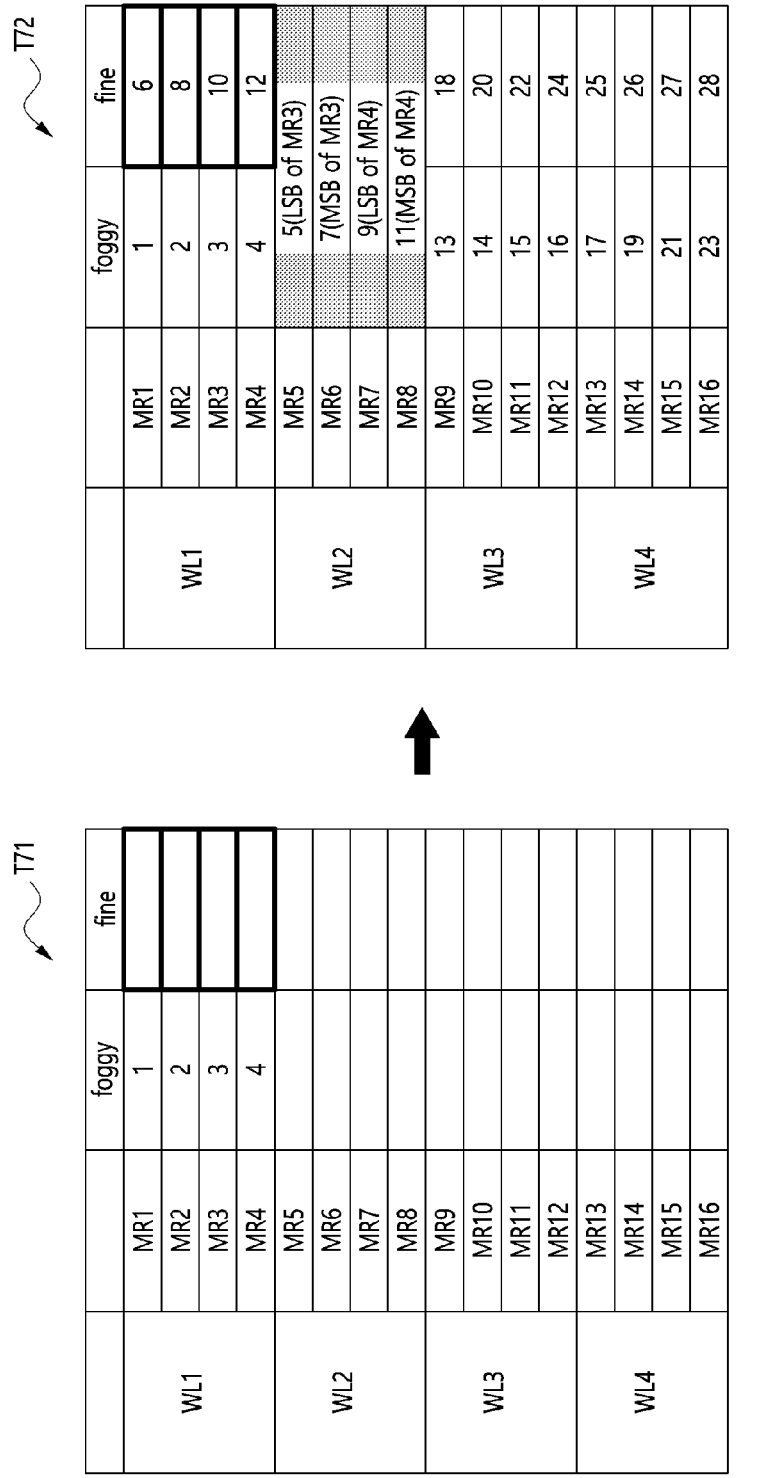
FIG. 7 is a diagram illustrating an operation of a controller of FIG. 1 according to an embodiment of the disclosed technology.

FIG. 7 is a diagram illustrating an operation of the controller 110 of FIG. 1 according to an embodiment of the disclosed technology.

Referring to FIG. 7, a situation illustrated by a table T71 may be the same as the situation illustrated by the table T51 of FIG. 5. Therefore, a program sequence illustrated by a table T72 may be the same as the program sequence illustrated by the table T52 of FIG. 5.

However, differently from the example of FIG. 5, memory cells within the first to fourth memory regions MR1 to MR4 may operate as MLCs. The target data should be selected according to a number of memory regions (e.g., four number in the case of FIG. 7), on which the urgent SLC program operations are to be performed, and thus the target data may be LSB data and MSB data stored in the third memory region MR3 and LSB data and MSB data stored in the fourth memory region MR4.

Although the target data is selected according to an order that the foggy program operations are recently performed as illustrated in FIG. 7, the embodiment will not be limited thereto. For example, data stored in the first and second memory regions MR1 and MR2 may be selected as the target data.

Figure 8:
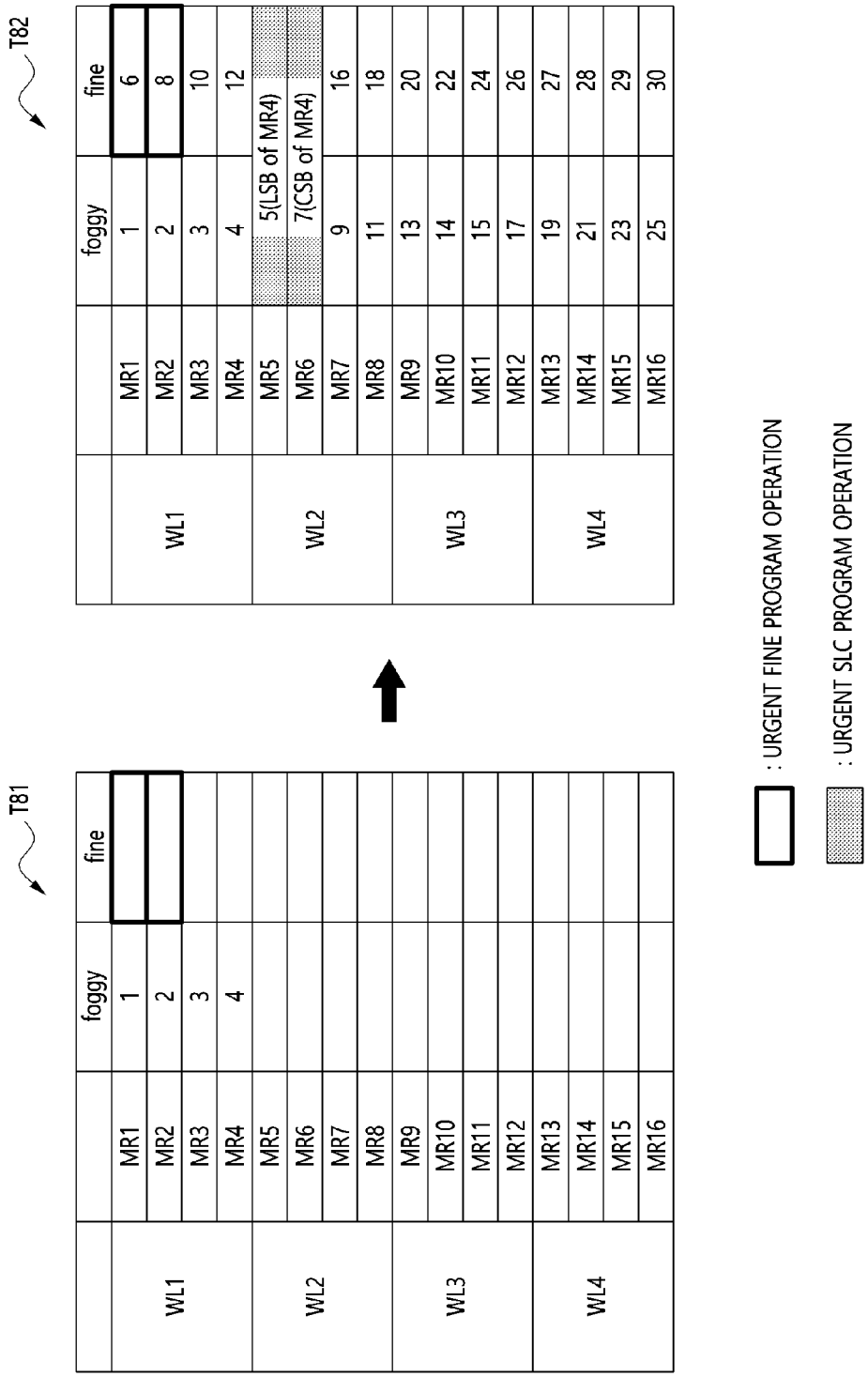
FIG. 8 is a diagram illustrating an operation of a controller of FIG. 1 according to an embodiment of the disclosed technology.

FIG. 8 is a diagram illustrating an operation of the controller 110 of FIG. 1 according to an embodiment.

Referring to FIG. 8, a table T81 shows a situation that the first to fourth program operations including the foggy program operations on the first to fourth memory regions MR1 to MR4 are completed. In this situation, there may be a case that the urgent fine program operations are required to be performed on the first and second memory regions MR1 and MR2.

Referring to FIG. 8, a table T82 shows a result of the program operations performed according to an embodiment. The urgent SLC program operations may be performed on the fifth and sixth memory regions MR5 and MR6. The target data may be selected from data (i.e., data stored in the fourth memory region MR4), on which a foggy program operation is completed most recently, as illustrated in FIG. 8. For example, when memory cells within the target memory region (i.e., the fourth memory region MR4) operate as QLCs, the target data to be stored in the respective fifth and sixth memory regions MR5 and MR6 may be respectively LSB data and CSB data stored in the target memory region (i.e., the fourth memory region MR4). For example, when memory cells within the target memory region (i.e., the fourth memory region MR4) operate as QLCs, the target data to be stored in the respective fifth and sixth memory regions MR5 and MR6 may be respectively USB data and MSB data stored in the target memory region (i.e., the fourth memory region MR4), which is different from the illustration of the table T82. After completion of all the urgent fine program operations on the first and second memory regions MR1 and MR2, remaining foggy and fine program operations may be performed according to the program sequence described with reference to the table T41 of FIG. 4.

After the completion of the urgent SLC program operations on the fifth and sixth memory regions MR5 and MR6, the controller 110 may perform the fine program operation (i.e., the twelfth program operation) on the target memory region (i.e., the fourth memory region MR4) instead of the skip or the omission of the fine program operation (i.e., the twelfth program operation) since it would be better if the USB data and the MSB data stored in the target memory region (i.e., the fourth memory region MR4) become stable. In other words, when the urgent SLC program operations are completed on only a part of all data stored in the target memory region (i.e., the fourth memory region MR4), the controller 110 may perform the fine program operation (i.e., the twelfth program operation) on the target memory region (i.e., the fourth memory region MR4) instead of the skip or the omission of the fine program operation (i.e., the twelfth program operation).

Figure 9:
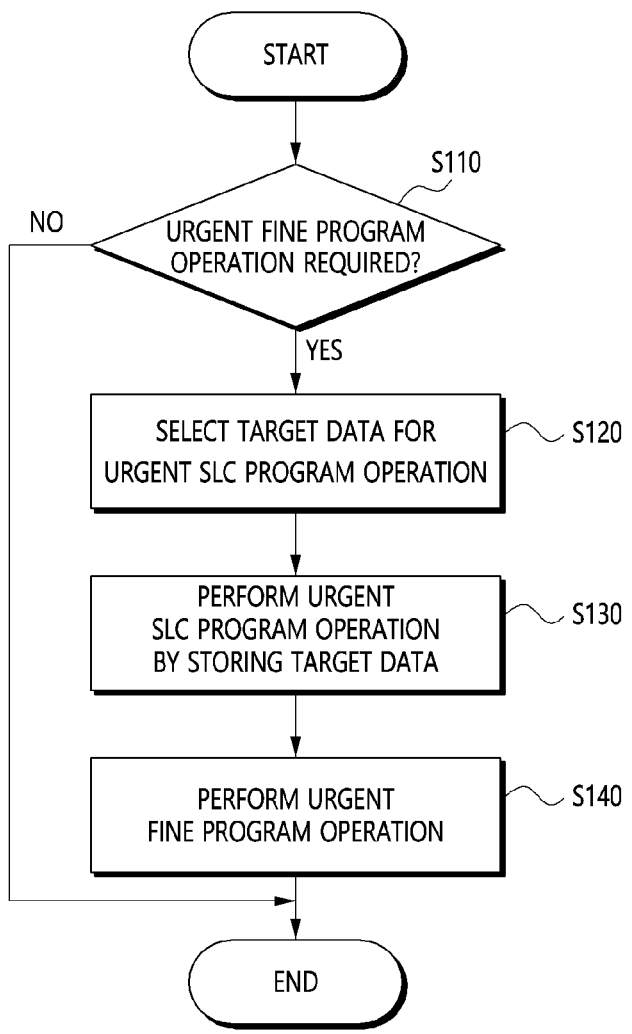
FIG. 9 is a flowchart illustrating an operation of the memory system of FIG. 1 according to an embodiment of the disclosed technology.

FIG. 9 is a flowchart illustrating an operation of the memory system 100 of FIG. 1 according to an embodiment of the disclosed technology.

Referring to FIG. 9, at step S110, the controller 110 may determine whether the urgent fine program operation is required on a particular memory region coupled to a first word line. When the urgent fine program operation is determined not to be required on the particular memory region, the process may end. When the urgent fine program operation is determined as required on the particular memory region, the process may proceed to step S120.

At step S120, the controller 110 may select target data for an urgent SLC program operation. The target data may include data for which the foggy program operation is completed most recently, among data for which the foggy program operation is completed but the fine program operation is not yet performed.

At step S130, the controller 110 may perform the urgent SLC program operation of storing the target data into a selected memory region. The selected memory region may be a memory region adjacent to the particular memory region on which the urgent fine program operation is to be performed, the adjacent memory region being coupled to a second word line subsequent to the first word line.

At step S140, the controller 110 may perform the urgent fine program operation on the particular memory region.

Figure 10:
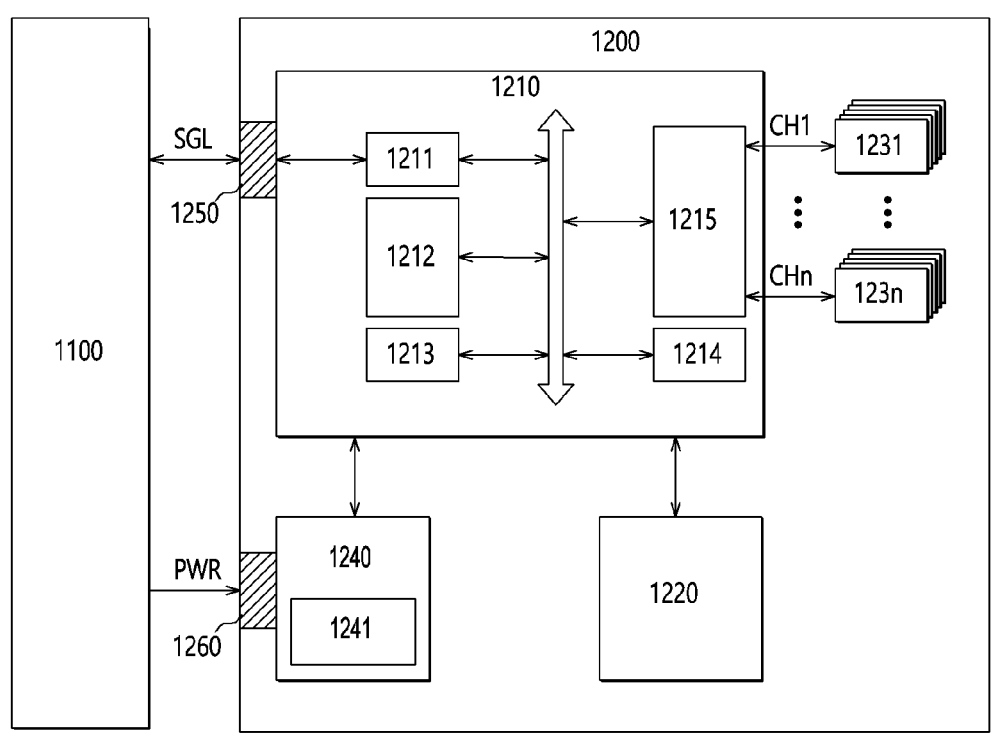
FIG. 10 is a diagram illustrating a data processing system including a solid state drive (SSD) in accordance with an embodiment of the disclosed technology.

FIG. 10 is a diagram illustrating a data processing system 1000 including a solid state drive (SSD) 1200 in accordance with an embodiment. Referring to FIG. 10, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may be configured in the same manner as the controller 110 shown in FIG. 1.

The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnect (PCI), PCI express (PCI-E) and universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The memory interface unit 1215 may provide control signals such as commands and addresses to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 11:
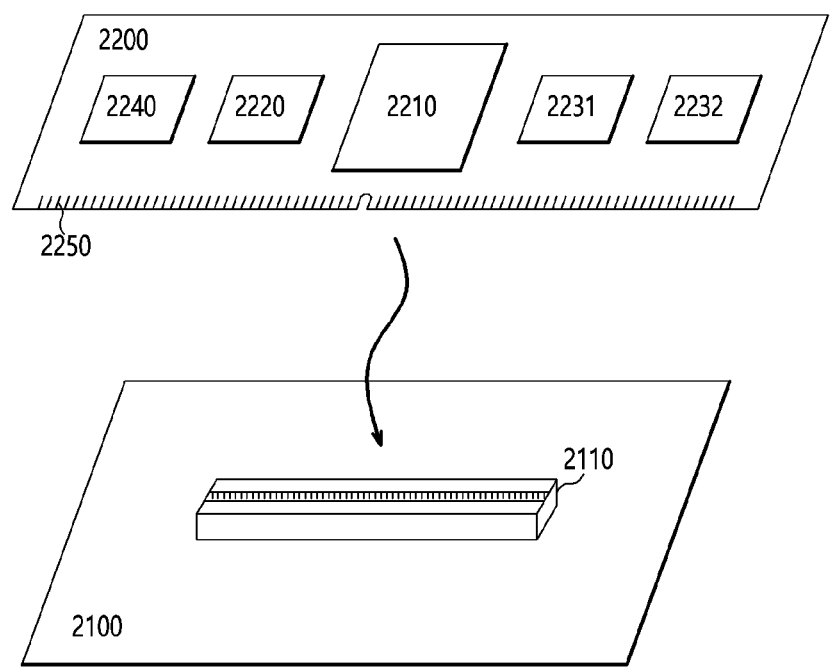
FIG. 11 is a diagram illustrating a data processing system including a memory system in accordance with an embodiment of the disclosed technology.

FIG. 11 is a diagram illustrating a data processing system 2000 including a memory system 2200 in accordance with an embodiment. Referring to FIG. 11, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 10.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 12:
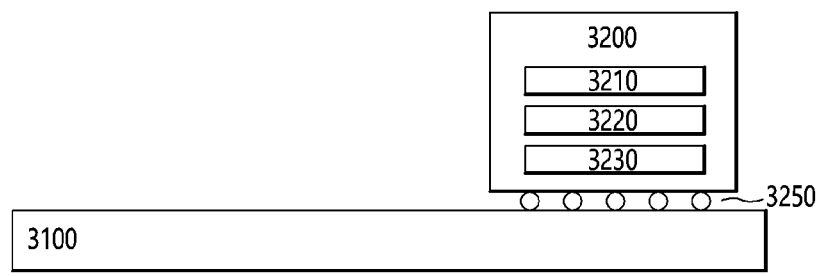
FIG. 12 is a diagram illustrating a data processing system including a memory system in accordance with an embodiment of the disclosed technology.

FIG. 12 is a diagram illustrating a data processing system 3000 including a memory system 3200 in accordance with an embodiment. Referring to FIG. 12, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 10.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 13:
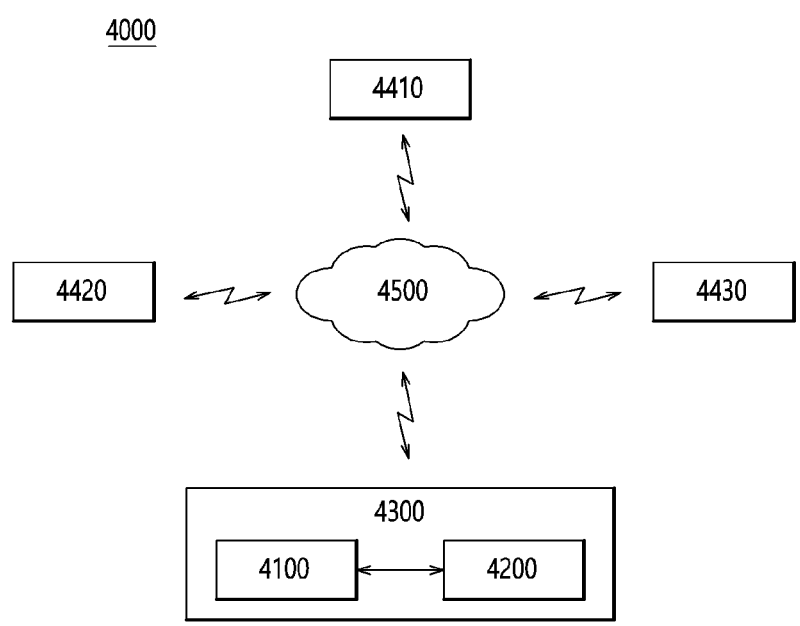
FIG. 13 is a diagram illustrating a network system including a memory system in accordance with an embodiment of the disclosed technology.

FIG. 13 is a diagram illustrating a network system 4000 including a memory system 4200 in accordance with an embodiment. Referring to FIG. 13, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the SSD 1200 shown in FIG. 10, the memory system 2200 shown in FIG. 11 or the memory system 3200 shown in FIG. 12.

Figure 14:
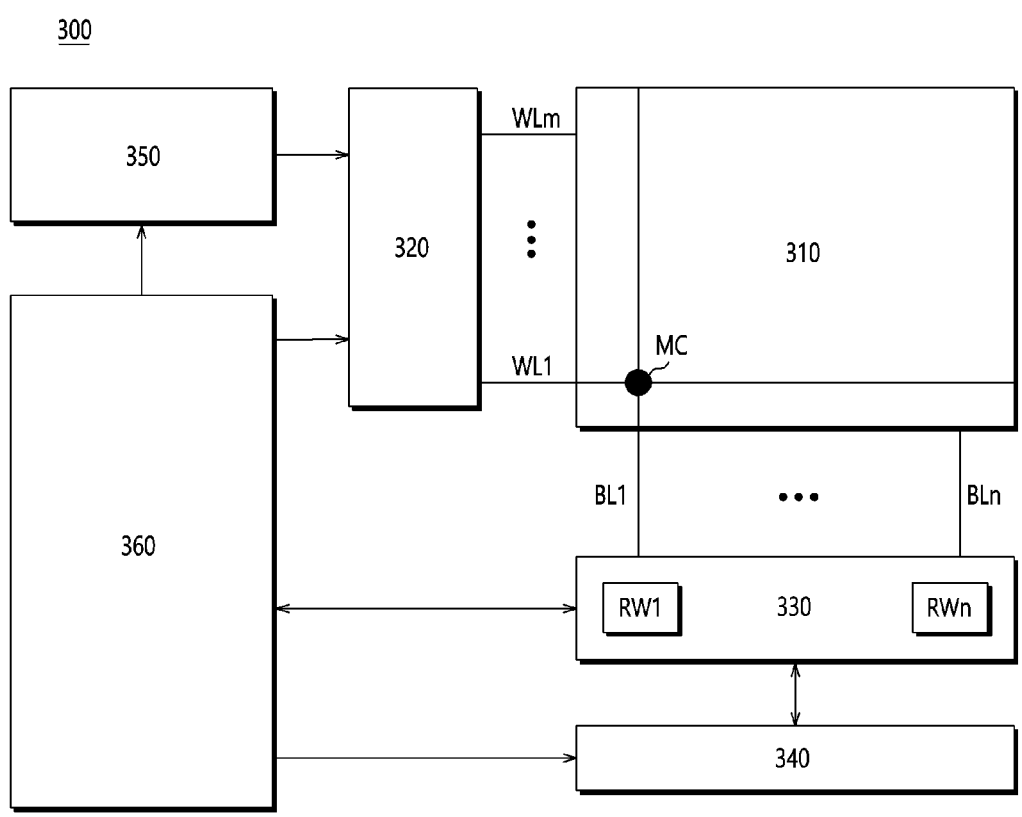
FIG. 14 is a block diagram illustrating a nonvolatile memory device included in a memory system in accordance with an embodiment of the disclosed technology.

FIG. 14 is a block diagram illustrating a nonvolatile memory device 300 included in a memory system in accordance with an embodiment. Referring to FIG. 14, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

According to an embodiment, a memory system and an operating method of the memory system may improve memory space availability while securing data reliability.

While certain embodiments have been described above, it will be understood to those skilled in the art that the embodiments described are by way of example only. Accordingly, variations and improvements of the disclosed embodiments and other embodiments may be made based on what is disclosed in this patent document.

What is claimed is:

1. A memory system comprising:
    a nonvolatile memory device including a memory block including a plurality of memory cells, a first memory region of memory cells coupled to a first word line and a second memory region of memory cells coupled to a second word line; and
    a controller configured to sequentially perform a foggy program operation on the second memory region, a fine program operation on the first memory region, and a fine program operation on the second memory region, when an urgent fine program operation on the first memory region is not required after a completion of a foggy program operation on the first memory region for storing data in the first memory region,
    wherein when the urgent fine program operation on the first memory region is required after the completion of the foggy program operation on the first memory region, the controller performs an urgent single level cell (SLC) program operation to store target data of the data into the second memory region without performing the foggy program operation on the second memory region and the fine program operation on the second memory region.

2. The memory system of claim 1, wherein the target data includes data in the memory block for which a foggy program operation is completed but a fine program operation is not yet performed.

3. The memory system of claim 1, wherein the target data includes data for which a corresponding foggy program operation is completed most recently as compared to remaining data in the memory block.

4. The memory system of claim 1, wherein the controller includes a memory and the controller is further configured to keep the data in the memory until the fine program operation on the first memory region is completed.

5. The memory system of claim 1, wherein the controller is further configured to skip the urgent fine program operation on the first memory region when the urgent SLC program operation is completed.

6. The memory system of claim 5, wherein the controller is further configured to update selected data of the data stored in the first memory region as invalid data, the selected data corresponding to the target data, and configured to update the target data stored in the second memory region as valid data.

7. The memory system of claim 1, wherein the first memory region and the second memory region are adjacent to each other and the second word line is subsequent to the first word line.

8. The memory system of claim 1, wherein the controller is further configured to perform the urgent fine program operation on the first memory region to ensure stability of the data when the urgent SLC program operation is completed.

9. An operating method of a memory system, comprising:
    performing a foggy program operation on a first memory region to store data in the first memory region, the first memory region being coupled to a first word line and within a memory block of the memory system;
    determining, after a completion of the foggy program operation on the first memory region, whether an urgent fine program operation is required on a first memory region;
    sequentially performing a foggy program operation on a second memory region, a fine program operation on the first memory region, and a fine program operation on the second memory region, in response to a determination that the urgent fine program operation is not required, the second memory region being coupled to a second word line and within the memory block; and
    performing an urgent single level cell (SLC) program operation on the second memory region to store target data of the data into the second memory region
    and skipping the foggy program operation on the second memory region and the fine program operation on the second memory region, in response to a determination of that the urgent fine program operation is required.

10. The operating method of claim 9, wherein the first memory region and the second memory region are adjacent to each other and the second word line is subsequent to the first word line.

11. The operating method of claim 9, wherein the target data includes data for in the memory block which a foggy program operation is completed but a fine program operation is not yet performed.

12. The operating method of claim 9, wherein the target data includes data for which a corresponding foggy program operation is completed most recently as compared to remaining data in the memory block.

13. The operating method of claim 9, further comprising skipping the urgent fine program operation on the first memory region when the urgent SLC program operation is completed.

14. The operating method of claim 13, further comprising:
updating, as invalid data, selected data of the data stored in the first memory region, the selected data corresponding to the target data; and
updating, as valid data, the target data stored in the second memory region.

* * * * *